US009326080B2

(12) United States Patent
Doller et al.

(10) Patent No.: US 9,326,080 B2
(45) Date of Patent: Apr. 26, 2016

(54) DEVICE TESTING USING ACOUSTIC PORT OBSTRUCTION
(71) Applicant: Robert Bosch GmbH, Stuttgart (DE)
(72) Inventors: Andrew J. Doller, Sharpsburg, PA (US); Dave Pravlik, Pittsburgh, PA (US)
(73) Assignee: Robert Bosch GmbH, Stuttgart (DE)
( * ) Notice: Subject to any disclaimer, the term of this patent is extended or adjusted under 35 U.S.C. 154(b) by 245 days.
(21) Appl. No.: 14/025,447
(22) Filed: Sep. 12, 2013
(65) Prior Publication Data
US 2014/0079229 A1 Mar. 20, 2014

Related U.S. Application Data
(60) Provisional application No. 61/701,040, filed on Sep. 14, 2012.

(51) Int. Cl.
*H04R 29/00* (2006.01)
*G01H 3/00* (2006.01)
*B81C 99/00* (2010.01)
(52) U.S. Cl.
CPC .......... *H04R 29/004* (2013.01); *B81C 99/0045* (2013.01); *G01H 3/005* (2013.01); *H04R 2201/003* (2013.01); *H04R 2410/03* (2013.01)
(58) Field of Classification Search
CPC ............. H04R 29/004; H04R 2410/03; H04R 2201/003; B81C 99/0045; B81C 99/005; G01H 3/005
USPC .......................................................... 381/58
See application file for complete search history.

(56) References Cited

U.S. PATENT DOCUMENTS 5,870,483 A * 2/1999 Wong et al. .................... 381/189
7,945,062 B2 5/2011 Wang et al.
7,949,142 B2 5/2011 Song
7,949,144 B2 * 5/2011 Harsch et al. ................. 381/312

(Continued)

FOREIGN PATENT DOCUMENTS

CN 201430194 3/2010
CN 102186134 9/2011

(Continued)

OTHER PUBLICATIONS

International Search Report and Written Opinion for Application No. PCT/US2013/059477 dated Nov. 21, 2013 (13 pages).
Premachandran et al., "Si-based microphone testing methodology and noise reduction," Proceedings of SPIE, vol. 4019, Apr. 10, 2000, pp. 588-592.
Schneider et al., "Electromagnetic Interference, Microphones and Cables," AES Convention 118; May 2005, AES, 60 East 42nd Street, Room 2520, New York 10165-2520, USA, May 1, 2005.
Thompson et al., "Noise in miniature microphones a)," The Journal of the Acoustical Society of America, American Institute of Physics for the Acoustical Society of America, New York, NY, US, vol. 111, No. 2, Feb. 1, 2002, pp. 861-866.

*Primary Examiner* — Davetta W Goins
*Assistant Examiner* — Daniel Sellers
(74) *Attorney, Agent, or Firm* — Michael Best & Friedrich LLP

(57) ABSTRACT

Methods and systems are taught for testing microphone packages—including measuring non-acoustic noise for the package. A package positioner holds a microphone package such that an acoustic input port of the microphone package is aligned with a plug. An actuator moves the plug relative to the microphone package between a first position—where the plug does not obstruct the acoustic input port of the microphone package—and a second position—where the plug obstructs the acoustic input port and restricts acoustic pressures from entering the microphone package through the acoustic input port. A controller monitors an output of the microphone package and identifies the output as indicative of isolated non-acoustic noise when the plug is in the second position.

17 Claims, 3 Drawing Sheets

(56) References Cited

U.S. PATENT DOCUMENTS

| | | |
|---|---|---|
| 8,215,151 B2 * | 7/2012 | Sammoura et al. ............ 73/1.38 |
| 2006/0042868 A1 * | 3/2006 | Berg et al. .................... 181/135 |
| 2006/0188114 A1 | 8/2006 | Wong et al. |
| 2009/0196429 A1 * | 8/2009 | Ramakrishnan et al. ....... 381/26 |
| 2010/0074451 A1 | 3/2010 | Usher et al. |
| 2011/0198714 A1 | 8/2011 | Yang |
| 2012/0148083 A1 | 6/2012 | Knauss et al. |
| 2012/0189152 A1 | 7/2012 | Reinmuth |
| 2012/0224726 A1 | 9/2012 | Pahl et al. |
| 2012/0310640 A1 * | 12/2012 | Kwatra et al. ................ 704/233 |
| 2013/0343564 A1 * | 12/2013 | Darlington ...................... 381/74 |
| 2014/0294218 A1 * | 10/2014 | Suvanto et al. ............... 381/337 |
| 2014/0328489 A1 * | 11/2014 | Ziegler et al. .................. 381/58 |

FOREIGN PATENT DOCUMENTS

| | | |
|---|---|---|
| DE | 102011012295 | 8/2012 |
| EP | 0268788 | 6/1988 |
| EP | 2373066 | 10/2011 |
| JP | 2011014990 | 1/2011 |

* cited by examiner

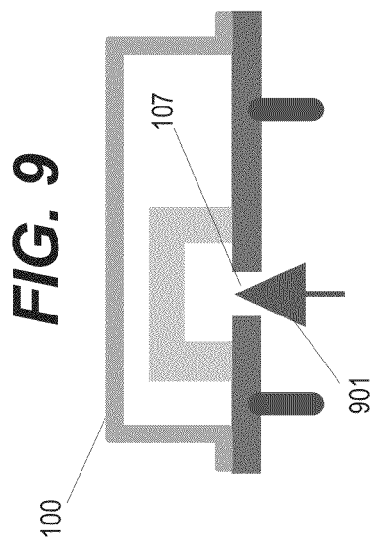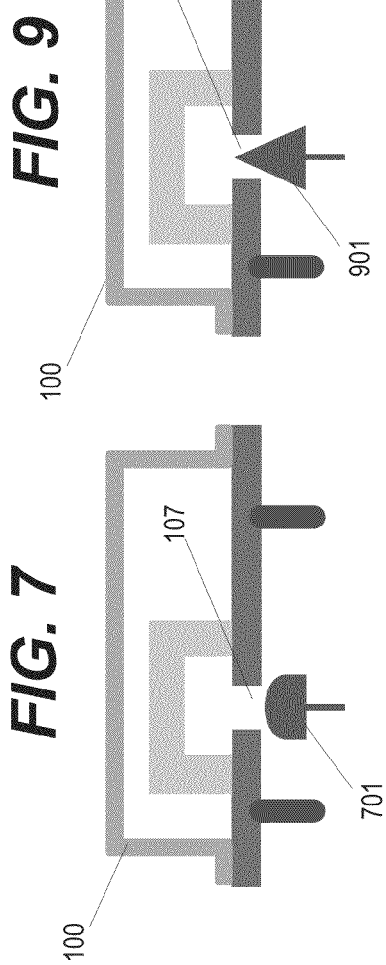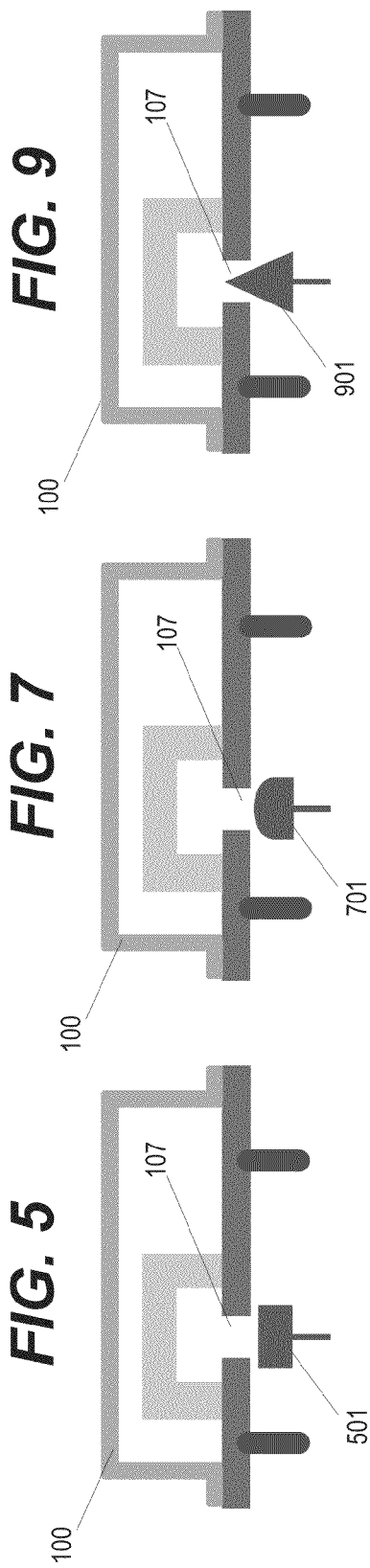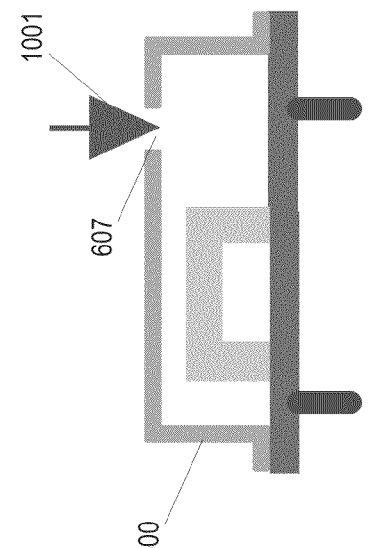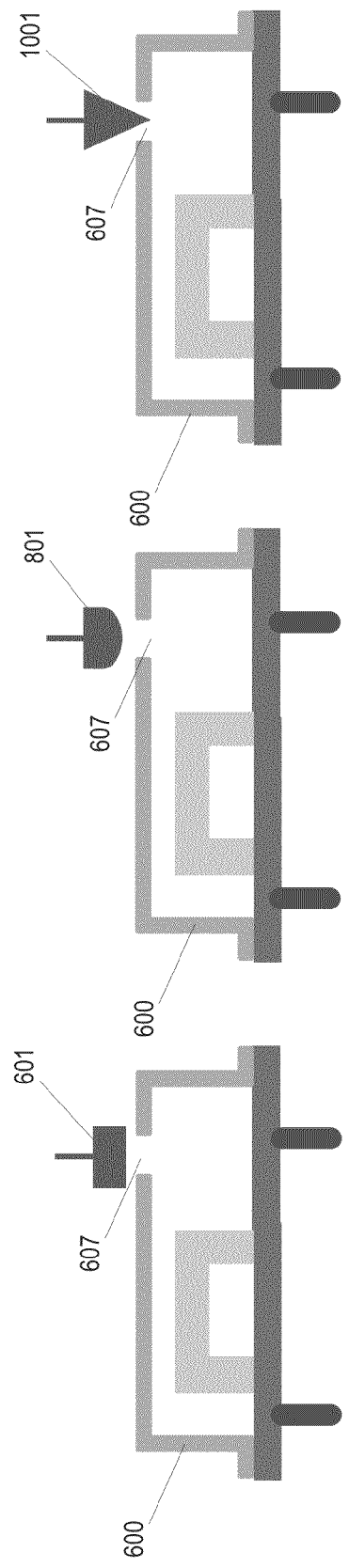

DEVICE TESTING USING ACOUSTIC PORT OBSTRUCTION

RELATED APPLICATIONS

This application claims the benefit of U.S. Provisional Patent Application No. 61/701,040, filed on Sep. 14, 2013 and entitled "NOISE CONTROL AND MEASUREMENT USING ACOUSTIC PORT OBSTRUCTION," the entire contents of which are incorporated herein by reference.

BACKGROUND

The present invention relates to methods and systems for testing microphone performance.

SUMMARY

In one embodiment, the invention provides a method of testing a microphone package using a testing apparatus that includes a plug. A microphone package is positioned on a testing apparatus such that an acoustic input port of the microphone package is aligned with the plug of the testing apparatus. The plug is controllably moved relative to the microphone package between a first position where the acoustic input port is not obstructed by the plug and a second position where the plug obstructs the acoustic input port and restricts acoustic pressures from entering the microphone package through the acoustic input port. The output of the microphone package is then analyzed while the plug is in the second position.

In some embodiments, the plug is controllably moved relative to the microphone package by controllably raising and lowering the plug while the microphone package remains stationary. In other embodiments, the plug is controllably moved relative to the microphone package by controllably raising and lowering the microphone package while the plug remains stationary.

In another embodiment, the invention provides a testing apparatus for measuring non-acoustic noise for a microphone package. The apparatus includes a plug, a package positioner, an actuator, and a controller. The package positioner holds a microphone package such that an acoustic input port of the microphone package is aligned with the plug. The actuator moves the plug relative to the microphone package between a first position—where the plug does not obstruct the acoustic input port of the microphone package—and a second position—where the plug obstructs the acoustic input port and restricts acoustic pressures from entering the microphone package through the acoustic input port. The controller is configured to monitor an output of the microphone package and to identify the output of the microphone package as indicative of isolated non-acoustic noise when the plug is in the second position.

Other aspects of the invention will become apparent by consideration of the detailed description and accompanying drawings.

BRIEF DESCRIPTION OF THE DRAWINGS

FIG. 5 is a cross-sectional diagram of a bottom-ported DUT and a testing apparatus with a square plug.

FIG. 6 is a cross-sectional diagram of a top-ported DUT and a testing apparatus with a square plug.

FIG. 7 is a cross-sectional diagram of a bottom-ported DUT and a testing apparatus with a rounded plug.

FIG. 8 is a cross-sectional diagram of a top-ported DUT and a testing apparatus with a rounded plug.

FIG. 9 is a cross-sectional diagram of a bottom-ported DUT and a testing apparatus with a self-centering conical plug.

FIG. 10 is a cross-section diagram of a top-ported DUT and a testing apparatus with a self-centering conical plug.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Figure 1A:
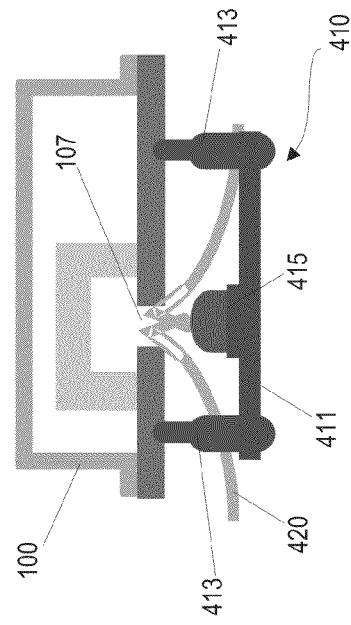
FIG. 1A is a cross-sectional diagram of a device under test ("DUT") and a testing apparatus in a first position according to one embodiment.

FIG. 1A illustrates an example of a MEMS microphone package 100. The MEMS microphone package in this example includes a lid 101 and a MEMS microphone die 103 mounted on a substrate 105. The substrate 105 is attached to the lid 101 to form a cavity that houses the MEMS microphone die 103. An acoustic port opening 107 is formed through the substrate 105. The MEMS microphone die 103 is mounted adjacent to the acoustic port opening 107 so that acoustic pressures (i.e., sounds) enter the microphone package 100 through the acoustic port opening 107 and interact with the microphone die 103. The microphone die 103 and associated electronic (not pictured) output an electronic representation of the acoustic pressures.

Microphone packages, such as microphone package 100, occasionally must undergo testing to confirm that they perform according to defined benchmarks. Operation of the microphone package 100 can also be improved by identifying, isolating, and ultimately controlling noise that affects the performance of the microphone, but is unrelated to the actual sound that enters the acoustic cavity through the acoustic port 107—for example, electromagnetic noise/interference caused by electronics that are incorporated into the microphone package.

FIG. 1A illustrates an example of a testing device 110 that achieves noise isolation by plugging the acoustic port 107 of the microphone package. With the acoustic port 107 plugged and sound pressures prevented from entering through the acoustic port 107, the output of the microphone package 100 can be analyzed to identify and mitigate non-acoustic "noise" that is affecting the output signal of the microphone package 100. The testing device 110 includes a base 111, a plurality of supports 113, and a plug 115. The plug 115 in this example is constructed of rubber. However, in other constructions, alternative materials such as, for example, cork can be used to construct the plug 115. A microphone package device under test ("DUT") 100 is positioned on the supports 113 such that the acoustic port opening 107 is aligned with the plug 115.

The entire testing apparatus 110 including the DUT 100 is positioned inside a testing chamber that can be used to further restrict and control the sounds that are applied to the DUT 100.

Figure 2:
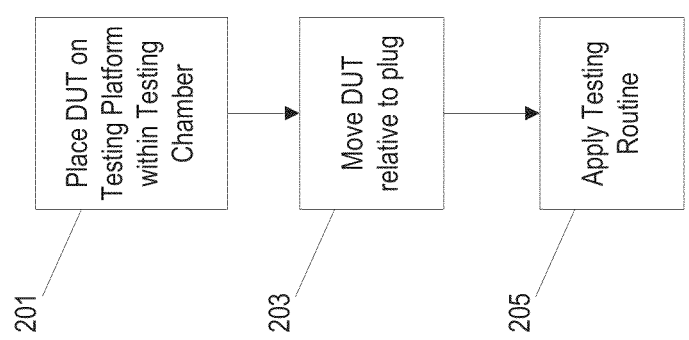
FIG. 2 is a flowchart of a method of testing a microphone using the testing apparatus of FIG. 1A.

FIG. 2 illustrates a method of using the test apparatus 110 to acoustically isolate the DUT 100. The DUT 110 is placed on the testing platform within a testing chamber (step 201). The acoustic port opening 107 of the DUT 100 is aligned with the plug 115. In some embodiments, a DUT receiving platform (not pictured) is located on top of the supports 113. The DUT receiving platform (or "package positioner") includes a recessed surface configured to receive the DUT 100 and hold the DUT 100 in an appropriately aligned position.

After the DUT 100 is placed on the testing platform, the DUT 100 and/or the plug 115 are moved relative to each other such that the plug 115 obstructs the acoustic input port 107 (step 203). As discussed in further detail below, depending upon the type of plug that is utilized, the plug 115 can be either fully or partially inserted into the acoustic input port 107 until a seal is formed or the plug 115 can be placed in contact with the bottom surface of the base 105 of the DUT 100 such that the entire acoustic input port 107 is covered by the plug 115. After the plug 115 is moved into position, a testing routine is applied to ensure proper performance of the microphone package 100 (step 205). The testing routine can include, for example, applying acoustic pressures to the microphone package and analyzing the response or monitoring the output of the microphone package while the acoustic input port 107 is plugged to identify and control non-acoustic noise that affects the output of the microphone package 100.

Figure 1B:
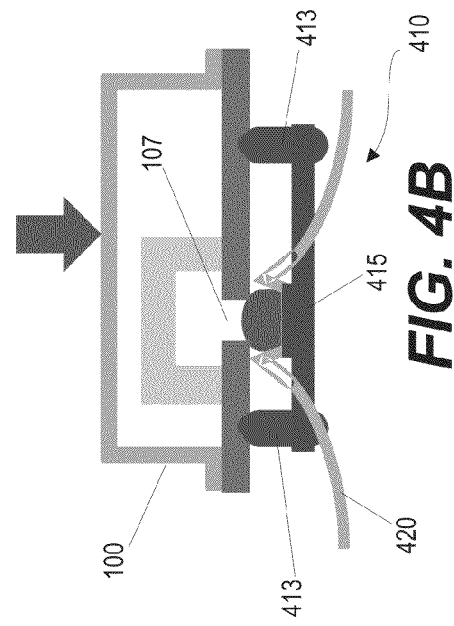
FIG. 1B is a cross-sectional diagram of the testing apparatus of FIG. 1A in a second position.

Returning now to FIG. 1A, the plug 115 is shown in a first position below the DUT 100. When in this position, acoustic pressures 120 (i.e., sound waves) are able to enter the acoustic port opening 107 where they are detected by the microphone die 103. As shown in FIG. 1B, the plug 115 is raised relative to the DUT 100 while the DUT 100 remains stationary. The plug 115 is raised until the acoustic input port 107 is obstructed and acoustic pressures 120 are unable to enter through the acoustic port opening 107.

Figure 3:
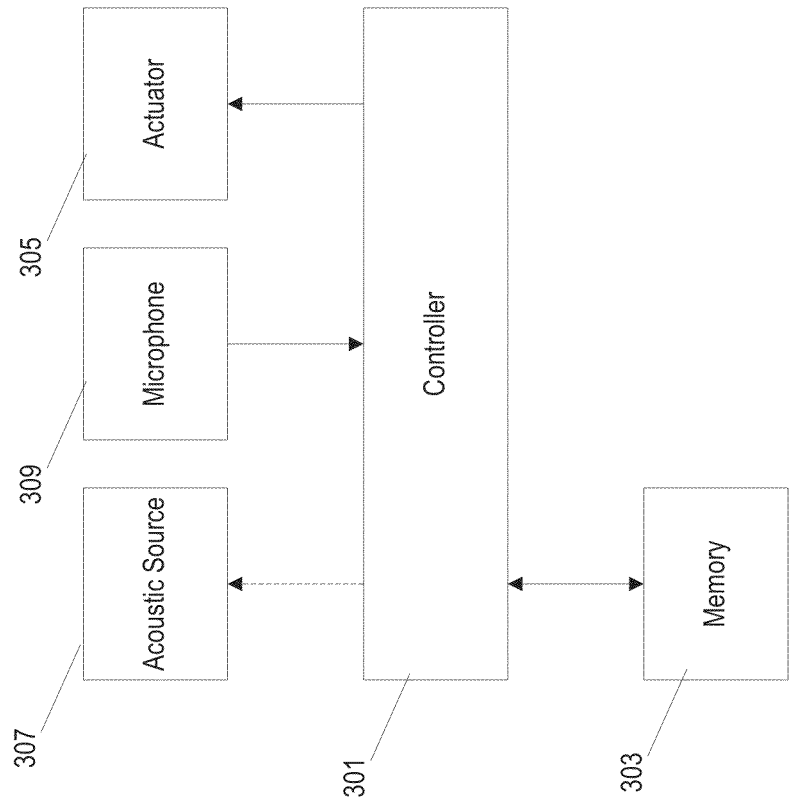
FIG. 3 is a schematic diagram of a control system for the testing apparatus of FIG. 1A.

The system of FIGS. 1A and 1B can be implemented as a mechanical device where an operator manually raises the plug to obstruct the acoustic port of the microphone package. The system can also be implemented as part of an automated test line. As part of one such automated system, the microphone package is automatically placed on the package positioner inside the acoustic test cavity and the plug is automatically raised before a testing protocol is initiated. FIG. 3 illustrates an example of one such automated system. A controller 301 controls the operation of the testing system. In this example, the controller 301 includes a microprocessor capable of executing instructions stored on a memory 303. However, alternative constructions can implement a number of other types of controllers including, for example, an application specific integrated circuit ("ASIC").

The controller 301 is coupled to an actuator 305 that raises and lowers the plug 115 relative to the base 111 of the testing apparatus 110. The actuator 305 can include, for example, a controllable hydraulic or pneumatic valve system. The controller 301 is also coupled to the output of the microphone 309. While the acoustic input port 107 is obstructed, non-acoustic noise is "isolated" in that acoustic pressures are not acting on the microphone and, therefore, the output signal of the microphone is more directly indicative of non-acoustic noise.

In some constructions, the controller 301 is also coupled to an acoustic source 307 that is used to apply acoustic pressures to the exterior of the microphone package 100 within the testing chamber. The testing apparatus 110 would then monitor the output of the microphone 100 and confirm whether the output of the microphone is an appropriate response to the applied sounds from the acoustic source.

Figure 4A:
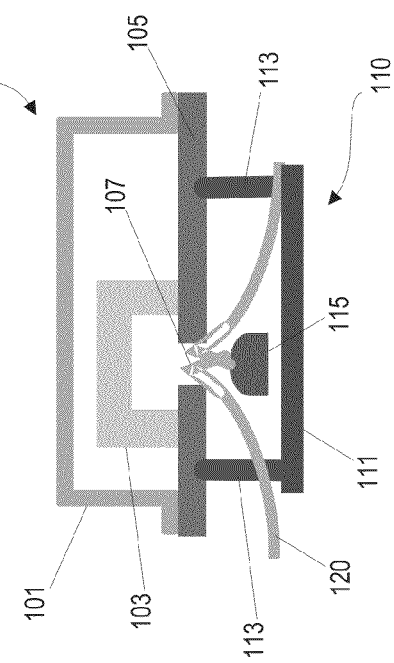
FIG. 4A is a cross-sectional diagram of a DUT and a testing apparatus according to another embodiment in a first position.

As discussed above, the testing apparatus 110 includes a controllably moveable plug that can be raised relative to a DUT 100 until it appropriately obstructs an acoustic input port 107 of the DUT 100. However, in other constructions, the plug remains stationary while the DUT is moved into place. FIG. 4A illustrates one such example. The DUT 100 is the same as the DUT 100 in the example of FIG. 1A. The testing apparatus 410 includes a base 411, a plurality of supports 413, and a plug 415. The plug 415 is stationary and does not move relative to the base. However, the supports 413 each include a pogo pin such that the pogo pins can be retracted to controllably lower a DUT 100 positioned on top of the supports 413.

FIG. 4A illustrates the testing apparatus 410 with a DUT 100 in a first position. When in this position, the plug 415 does not obstruct the acoustic input port 107 and acoustic pressures 420 can enter the microphone package 100 through the acoustic input port 107. However, as illustrated in FIG. 4B, when the supports 413 are retracted and the DUT 100 is lowered into a second position, the plug 415 obstructs the acoustic input port 107 and the acoustic pressures 420 are restricted from entering the microphone package 100 through the acoustic input port 107.

Figure 4B:
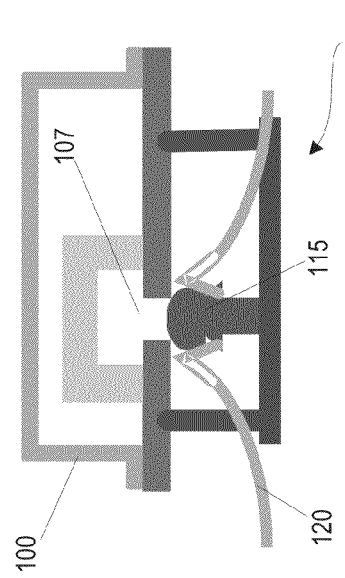
FIG. 4B is a cross-sectional diagram of the testing apparatus of FIG. 4A in a second position.

The testing apparatus of FIGS. 4A and 4B can be controlled manually or by using a control system such as illustrated in FIG. 3. However, in the case of testing apparatus 410, the actuator 305 controls the retraction and extension of the pogo pins of the supports 413 to controllably raise and lower the DUT 100 relative to the plug 415.

The constructions described above only represent some of the potential arrangements and configurations of a testing apparatus. Other constructions and arrangements are possible. For example, in the constructions discussed above, only one of the plug or the DUT is moved in order to position the plug such that it obstructs the acoustic input port of the DUT. However, in some other embodiments, the testing apparatus can be arranged such that both the DUT and the plug are moved. Additionally, although the examples discussed above illustrate linear movement of a plug towards the DUT, in other constructions the testing apparatus can be arranged such that the plug moves laterally along the surface of the base of the DUT until it is adjacent to the acoustic input port.

The testing apparatus can also be adjusted to accommodate different types of microphone packages and to utilize different types of plugs. For example, FIG. 5 illustrates a testing apparatus that utilizes a square plug 501. The square plug 501 is sized larger than the acoustic input port 107 and, as such, does not even partially fit inside the acoustic input port 107. Instead, the plug 501 is positioned adjacent to the acoustic port opening on the exterior surface of the DUT 100 such that the entire acoustic input port is covered by the plug 501.

FIG. 6 illustrates an example of a testing apparatus configured for testing a top-ported microphone package 600. Unlike DUT 100, the acoustic input port 607 of the top-ported package 600 is positioned on the lid of the microphone package 600. In this top ported configuration—which also utilizes a square plug 601—the testing apparatus obstructs the acoustic input port 607 by either raised the DUT 600 until it contacts the plug 601 or by lowering the plug 601 until it contacts the DUT 600.

FIG. 7 illustrates another example of a testing apparatus for a bottom-ported microphone package 100. However, unlike FIG. 5, the testing apparatus of FIG. 7 includes a rounded plug 701. When the acoustic input port 107 of a DUT 100 is obstructed by the rounded plug 701, the rounded plug 701 partial extends into the acoustic input port 107. FIG. 8 illustrates a testing apparatus that utilizes a rounded plug 801 for a top-ported package 600.

FIG. 9 illustrates yet another example of a testing apparatus for a bottom-ported microphone package 100. In this example, the plug 901 is a conical shape. The cone shape of this self-centering plug 901 allows the plug 901 (or the microphone package) to move laterally as the plug is inserted to account for manufacturing variations in different microphone packages while ensuring that the acoustic port 107 is sufficiently obstructed during the testing. FIG. 10 illustrates a testing apparatus that utilizes a self-centering conical plug for a top-ported package 600.

Thus, the invention provides, among other things, systems and methods for testing a microphone package by obstructing the acoustic input port with a plug. Various features and advantages of the invention are set forth in the following claims.

What is claimed is:

1. A method of testing a microphone package using a testing apparatus that includes a plug, the method comprising:
    positioning the microphone package on the testing apparatus such that an acoustic input port of the microphone package is aligned with the plug of the testing apparatus;
    controllably moving the plug relative to the microphone package between
        a first position where the acoustic input port is not obstructed by the plug and
        a second position where the plug obstructs the acoustic input port and restricts acoustic pressures from entering the microphone package through the acoustic input port;
    analyzing an output of the microphone package with the plug in the second position, wherein analyzing the output of the microphone package further includes identifying the output of the microphone package as isolated non-acoustic noise; and
    adjusting operation of the microphone package based on the output of the microphone package when the plug is in the second position to account for the non-acoustic noise.

2. The method of claim 1, wherein controllably moving the plug relative to the microphone package includes raising and lowering the plug while the microphone package remains stationary.

3. The method of claim 1, wherein controllably moving the plug relative to the microphone package includes raising and lowering the microphone package while the plug remains stationary.

4. The method of claim 1, wherein the isolated non-acoustic noise is indicative of electromagnetic interference that affects the output of the microphone package.

5. The method of claim 1, wherein the plug includes a partially rounded surface that partially extends into the acoustic input port of the microphone package when the plug is in the second position.

6. The method of claim 1, wherein the plug includes a flat surface that is positioned against an exterior surface of the microphone package covering the acoustic input port when the plug is in the second position.

7. The method of claim 1, wherein the plug includes a conical plug that self-centers as the plug is inserted into the acoustic input port as the plug moves from the first position to the second position.

8. A testing apparatus for measuring non-acoustic noise for a microphone package, the testing apparatus comprising:
    a plug;
    a package positioner configured to hold a microphone package such that an acoustic input port of the microphone package is aligned with the plug;
    an actuator configured to move the plug relative to the microphone package between
        a first position where the plug does not obstruct the acoustic input port of the microphone package and
        a second position where the plug obstructs the acoustic input port of the microphone package and restricts acoustic pressures from entering the microphone package through the acoustic input port; and
    a controller configured to monitor an output of the microphone package and to identify the output of the microphone package as indicative of isolated non-acoustic noise when the plug is in the second position,
    wherein the plug includes a partially rounded surface that partially extends into the acoustic input port of the microphone package when the plug is in the second position.

9. The testing apparatus of claim 8, wherein the actuator is configured to move the plug relative to the microphone package by raising and lowering the plug while the microphone package remains stationary.

10. The testing apparatus of claim 8, wherein the actuator is configured to move the plug relative to the microphone package by raising and lowering the package positioner while the plug remains stationary.

11. The testing apparatus of claim 8, wherein the controller is configured to identify electromagnetic interference that affects the output of the microphone package based on the output of the microphone package when the plug is in the second position.

12. The testing apparatus of claim 8, further comprising a testing chamber that encloses the plug, the package positioner, and the microphone package when a microphone package is being tested.

13. A testing apparatus for measuring non-acoustic noise for a microphone package, the apparatus comprising:
    a plug;
    a package positioner configured to hold a microphone package such that an acoustic input port of the microphone package is aligned with the plug;
    an actuator configured to move the plug relative to the microphone package between
        a first position where the plug does not obstruct the acoustic input port of the microphone package and
        a second position where the plug obstructs the acoustic input port of the microphone package and restricts acoustic pressures from entering the microphone package through the acoustic input port; and
    a controller configured to monitor an output of the microphone package and to identify the output of the microphone package as indicative of isolated non-acoustic noise when the plug is in the second position,
    wherein the plug includes a conical plug that self-centers as the plug is inserted into the acoustic input port as the actuator moves the plug from the first position to the second position.

14. The testing apparatus of claim 13, wherein the actuator is configured to move the plug relative to the microphone package by raising and lowering the plug while the microphone package remains stationary.

15. The testing apparatus of claim 13, wherein the actuator is configured to move the plug relative to the microphone package by raising and lowering the package positioner while the plug remains stationary.

16. The testing apparatus of claim 13, wherein the controller is configured to identify electromagnetic interference that affects the output of the microphone package based on the output of the microphone package when the plug is in the second position.

17. The testing apparatus of claim 13, further comprising a testing chamber that encloses the plug, the package positioner, and the microphone package when a microphone package is being tested.

* * * * *